United States Patent [19]
Stenberg

[11] Patent Number: 5,920,090
[45] Date of Patent: Jul. 6, 1999

[54] SWITCHED MAGNETIC FIELD SENSITIVE FIELD EFFECT TRANSISTOR DEVICE

[75] Inventor: Lars J. Stenberg, Roskilde, Denmark

[73] Assignee: Microtronic A/S, Roskilde, Denmark

[21] Appl. No.: 09/011,688

[22] PCT Filed: Aug. 26, 1996

[86] PCT No.: PCT/DK96/00356

§ 371 Date: Feb. 13, 1998

§ 102(e) Date: Feb. 13, 1998

[87] PCT Pub. No.: WO97/09742

PCT Pub. Date: Mar. 13, 1997

[30] Foreign Application Priority Data

Aug. 24, 1995 [DK] Denmark .................................. 0949/95

[51] Int. Cl.[6] .............................. H01L 27/22; H01L 29/68
[52] U.S. Cl. ........................... 257/252; 257/365; 257/401; 257/421
[58] Field of Search ..................................... 257/252, 421, 257/422, 425, 427, 401, 365

[56] References Cited

U.S. PATENT DOCUMENTS

| | | | |
|---|---|---|---|
| 3,553,540 | 3/1967 | Puterbaugh | 257/252 |
| 3,714,523 | 1/1973 | Bate | 257/252 |
| 4,048,648 | 9/1977 | Vinal | 257/252 |
| 4,129,880 | 12/1978 | Vinal | 257/252 |
| 4,163,986 | 8/1979 | Vinal | 257/252 |
| 5,083,174 | 1/1992 | Kub | 257/252 |

*Primary Examiner*—Donald L. Monin, Jr.
*Attorney, Agent, or Firm*—Watson Cole Grindle Watson P.L.L.C.

[57] ABSTRACT

The invention concerns a Switched MAGFET (MAGnetic field sensitive Field Effect Transistor). A preferred SMAGFET embodiment consists of a MAGFET structure with two equal sized drain contacts (3, 4), a gate area consisting of two equal sized and electrically isolated gate regions G1 and G2 (5, 6) separated by a third isolated gate region Gc (7) placed along the symmetry line of the device and slightly overlapping G1 and G2. The SMAGFET has a common source (1). By varying the gate voltage on Gc (with reference to the common source contact), the magnetic sensitivity of the SMAGFET may be controlled. By applying a first voltage on Gc, exchange of carriers from the channels beneath G1 and G2 is blocked. In case of an applied magnetic field, this will prevent Lorentz deflected carriers to cross symmetry line and redistribute the drain currents, i.e. the magnetic field sensitivity is virtually zero as the drain currents will remain unaffected by the magnetic induction. By changing the voltage at Gc to a second level, exchange of carriers from channels beneath G1 and G2 may take place. In case of an applied magnetic field, this will allow Lorentz deflected carriers to cross symmetry line and redistribute the drain currents.

4 Claims, 6 Drawing Sheets

SWITCHED MAGNETIC FIELD SENSITIVE FIELD EFFECT TRANSISTOR DEVICE

The present invention relates to a specific and well known magnetic field sensitive device based on a Field Effect Transistor (FET) structure with a drain area splitted into two each connected to a drain contact, a gate contact area and a common source area. In literature, the device described above, is named a split-drain 'MAGnetic field sensitive Field Effect Transistor', commonly abbreviated MAGFET. MAGFETs are used for detection and measuring presence, magnitude and/or direction of a magnetic field. The output is a current difference essentially proportional to the magnetic field (magnetic induction). The sensitivity of the device is defined as the absolute value of the ratio between measured current difference (in Ampere) and magnetic induction (in Tesla).

The operating principle is based on the Lorentz force acting on electrically charged particles moving in a magnetic field:

$$F = q\, V \times B$$

where q is a scalar quantity representing the signed electrical charge of the particle(s), F, V and B are vector quantities representing the deflection force, the particle speed and the magnetic field induction (or magnetic flux density), respectively. The magnitude of F is at its maximum when V and B are perpendicular.

The Lorentz force is the common origin of operating principle for many types of magnetic field sensitive devices such as Hall effect structures, magnetic sensitive bipolar transistors and—as stated above—magnetic sensitive FET structures—MAGFETs. MAGFETs have gained widespread use due to their compatibility with standard Complementary Metal Oxide Semiconductor CMOS silicon processing allowing straightforward monolithic integration with associated analogue and/or digital electronic circuitry. MAGFETs feature good characteristics such as relatively high sensitivity for magnetic induction, a good linearity and very low cost. However, MAGFETs are also characterised by fair to poor accuracy at low magnetic inductions mainly due to offset errors (e.g. output is<>0 for B=0) between the split drains. Furthermore, this offset is a.o. a complicated function of temperature, which severely reduces the usability of MAGFETs for high precision measurements of low magnetic fields.

Magnet field sensors of various kind have been described in e.g. EP-A1-0 563 630 and U.S. Pat. No. 5,208,477.

In the first patent, a description is given of a magnetic field sensitive device in form of a lateral bipolar transistor with a base region of one type, an emitter region of the opposite type to emit charged carriers and a collector region to collect the carriers, and to which two metal contacts have been attached to split the collector current. A non-zero magnetic field will cause a Lorentz deflection of the carriers, whereby the collector current distribution is altered and a difference current may be measured between the two collector contacts.

In the second patent, different MOS FET magnetic field sensitive devices are described, e.g. an embodiment which is based on the well known MAGFET but featuring a resistive gate area under which a favourable electrical field profile may be obtained in the channel, causing a better control of carrier density in the channel for a given gate voltage bias, resulting in an increased sensitivity of the structure.

The purpose of the present invention is to improve the well known split-drain MAGFET device by structural modifications that may significantly reduce the undesired offset errors and thereby enhance the usability and performance of this device type.

According to the invention this is accomplished by splitting the MAGFET gate region into two equal sized, electrically isolated and adjacent but not overlapping gate regions, each accessible with a separate gate contact, in the following named G1 and G2. In between G1 and G2 and slightly overlapping G1 and G2, a third gate region is placed. This third gate region is electrically isolated from G1 and G2 and is accessible by a gate contact named Gc.

The device is dimensioned in a way that the device features the following behaviour:

At a certain characteristic voltage applied to Gc (with reference to the common source), the channel beneath Gc is brought into deep accumulation, creating an isolating region beneath Gc, effectively blocking the exchange of carriers between the channels beneath G1 and G2. In this case, the two drain currents is unaffected by any applied magnetic field. Changing the voltage at Gc to another characteristic voltage, the channel beneath Gc is brought into strong inversion creating a conductive region beneath Gc and enabling a nearly free exchange of carriers between the channels beneath G1 and G2. In this case, the two drain currents are affected by an applied magnetic field.

By switching the gate voltage at Gc between the two characteristic voltages for deep accumulation and strong inversion, respectively, the magnetic sensitivity of the device may be switched simultaneously from virtually zero to full (maximum) MAGFET sensitivity.

In other words, the magnetic field sensitivity of the device is electrically controllable and the time delay associated with switching the sensitivity is in the lower limit determined by generation-recombination of carriers in the channel regions and as such very small i.e. typically below 1 $\mu$s.

The drain current offset of MAGFETs, which causes measurement errors, mainly originates from unintentional and unavoidable deviations from absolute geometrical device symmetry, mobility inhomogenities and fluctuations in the channels beneath gate regions. As these non-idealities remain virtually unaffected by changing the voltage on Gc, the device offset is essentially unaltered in the zero and full sensitivity mode of operation.

This behaviour allows simple and effective compensation of the offset by so called 'correlated double sampling', even in cases where the offset is temperature and slowly time dependent: By zeroing the device sensitivity to magnetic fields, the drain current difference which in this case is equal to the offset may be measured and stored temporarily. If the magnetic field sensitivity of the device then, as fast as possible, is returned to full level, by switching the voltage at Gc to the proper level, the drain current difference now represent the magnetic induction plus the inherent offset. By subtracting the stored offset obtained in the first measurement from the result of the second measurement, the resulting value represent the magnetic field induction without any contributions from offset. The 'correlated double sampling' may be realised by simple and well known electronic circuit techniques.

In case the offset is time varying, the two measurements (samples) must be performed with as small delay as possible. As mentioned above, the lower limit is set by generation-recombination mechanisms in the device and is of the order of T=1 $\mu$s. If the time constant for the offset variation is significantly larger than this lower limit, a very good compensation is obtained. The major contributors to offset, geometrical and electrical asymmetry, 1/f noise and mobility non-uniformity all exhibit time constants far exceeding 1 $\mu$s.

Due to the features of this invention, the device is named 'Switched MAGFET' or SMAGFET in the following.

In the first and most simple embodiment of the invention, the SMAGFET is designed symmetrically and used as above. The third gate region is made sufficiently narrow, compared to the width of G1 and G2 gate regions, in order to reduce edge effects when switching the voltage on this gate.

In a second embodiment of the invention, the simple SMAGFET is refined with two additional dummy gate regions Gcd1 and Gcd2. The two additional dummy gate regions are contacted by a common contact Gcd.

By adding a gate region to each open side of the simple embodiment and switching the associated gate contact Gcd in opposite phase to the switching of Gc, edge effects in the channel beneath Gc may be partly compensated by edge effects in the regions beneath the two dummy gate regions.

In a third embodiment of the invention, the SMAGFET consists of an interconnected assembly of two equal sized SMAGFETS. By interconnecting and placing the two devices properly, minor misalignments of the third gate, which is typically observed deviation from ideal symmetry in practical devices, may be compensated.

In the following, the three embodiments will be explained in detail with references to the well known MAGFET and associated drawings.

Figure 1:
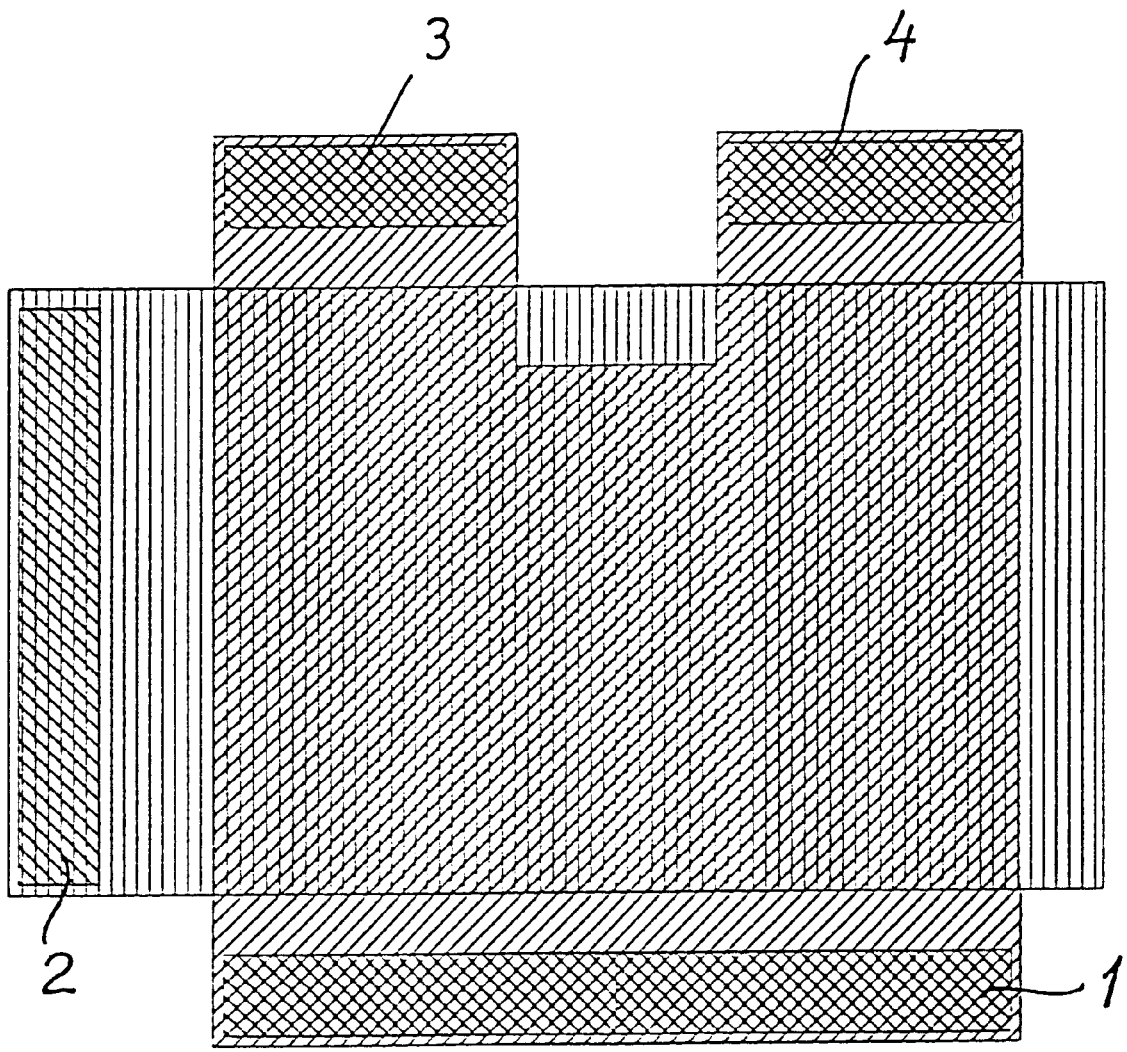
FIG. 1 is a top-view draft of the well known MAGFET which is the origin of this invention.

The well known MAGFET representing prior art is shown in FIG. 1. The two equal sized drain contacts are 3, 4, respectively. The common gate contact is labelled 2 and the common source contact is labelled 1.

Figure 2:
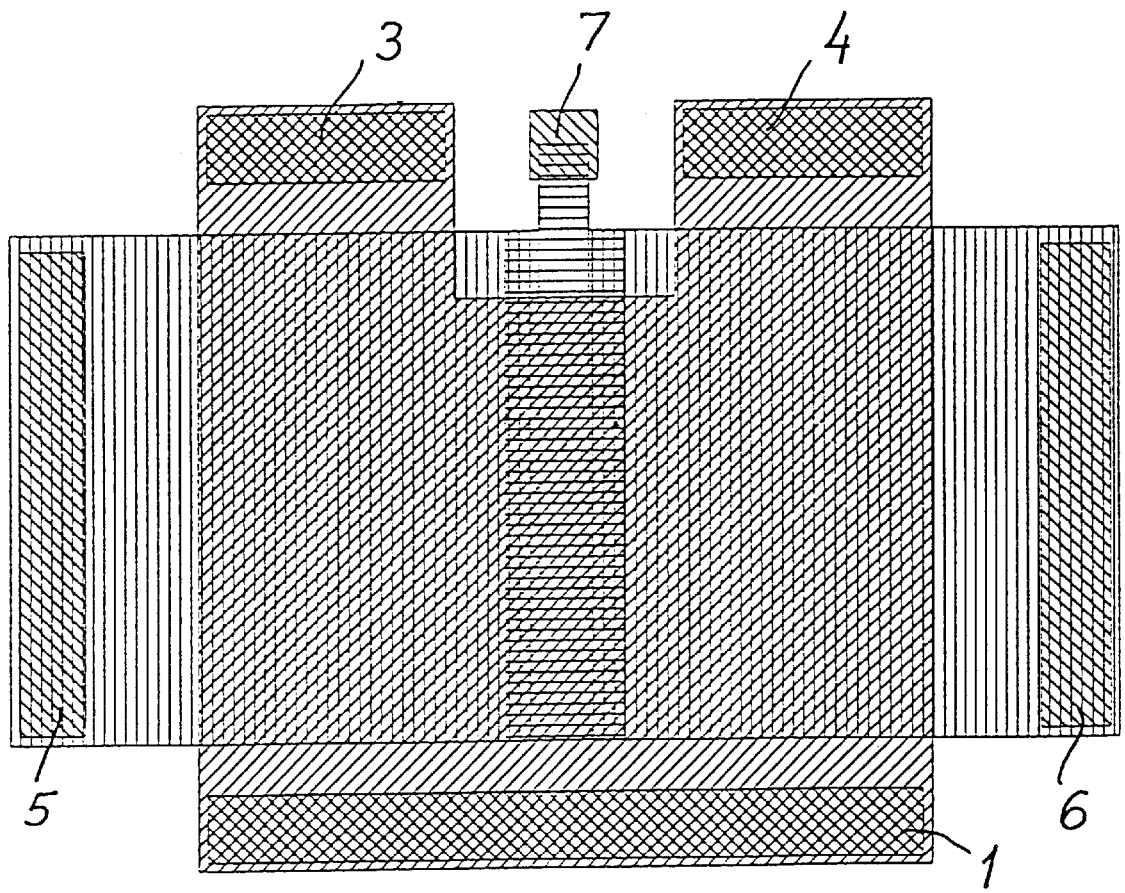
FIG. 2 is a top-view draft illustrating the first and most simple embodiment of the SMAGFET.

Using a similar top-view, FIG. 2 shows the Switched MAGFET or SMAGFET according to the invention. The two equal sized drain contacts are labelled 3, 4, respectively. The two gate contacts G1 and G2, connecting to two equal sized gate regions, are labelled 5 and 6, respectively. The third gate contact Gc, which is centred in the vertical symmetry line of the device, is labelled 7 and the common source contact is labelled 1.

By applying different voltages to Gc (7) with reference to the common source (1), the magnetic field sensitivity of the SMAGFET may be controlled. Typically, the voltage at Gc is Switched abruptly between two characteristic voltages representing two distinct sensitivity modes: full and zero sensitivity.

In the full sensitivity mode, the voltage at Gc (7) (referenced to the common source 1) should be larger than the threshold voltage VT3 for the third gate Gc (7) ensuring strong inversion beneath Gc (7). In this case, carriers beneath G1 (5), G2 (6) and Gc (7) see no significant barriers when deflected by the Lorentz force originating from an applied magnetic field and the sensitivity i.e. the drain current difference versus applied magnetic induction is very close to the sensitivity for the well known MAGFET.

In the zero sensitivity mode, the voltage at Gc (7) should be somewhat less than VT3 ensuring deep accumulation of the channel beneath Gc (7) and thereby emptying the channel for carriers. In this case, carriers beneath G1 (5) and G2 (6) can not cross the region beneath Gc (7) if it has a certain minimum width. The Lorentz force acting on the carriers in the channels beneath G1 (5) and G2 (6) in case of an applied magnetic field, will then not result in any carrier exchange crossing the symmetry line and therefore do not give any contribution to the difference drain current i.e. the sensitivity to magnetic induction is virtually zero in this mode.

The inherent offset in the SMAGFET, caused by in practise unavoidable deviations from exact geometrical and electrical symmetry of the split drains, is to first order independent of the sensitivity mode of operation. As the SMAGFET can be switched (nearly) abruptly between zero and full sensitivity for magnetic induction, well known 'correlated double sampling' technique may be efficiently used to compensate for this offset. An associated electronic circuit may realise 'correlated double sampling' by making two measurements within short time. In the first measurement, the SMAGFET is set in zero sensitivity mode and the drain difference current is measured and stored temporarily. The value represent the offset only. Next, the SMAGFET is switched to full sensitivity mode and the second measurement is performed. The measurement value (an amount proportional to magnetic induction plus offset) is then reduced by the stored value (offset) and the result represents the magnetic induction alone. This sequence may be repeated as often as required.

Figure 3:
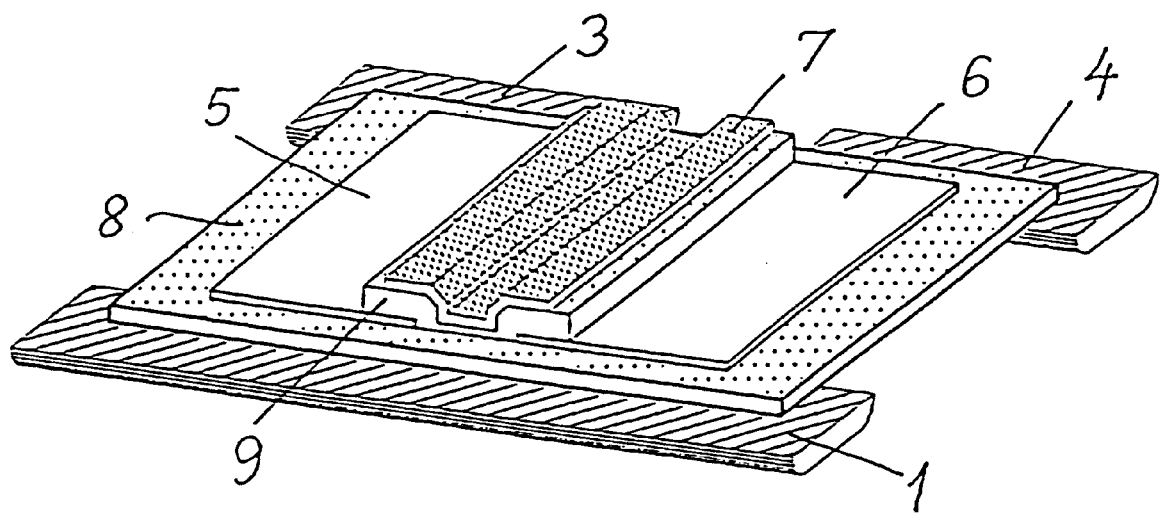
FIG. 3 is a draft illustrating the first and most simple embodiment of the SMAGFET but now in a perspective view.
Figure 4:
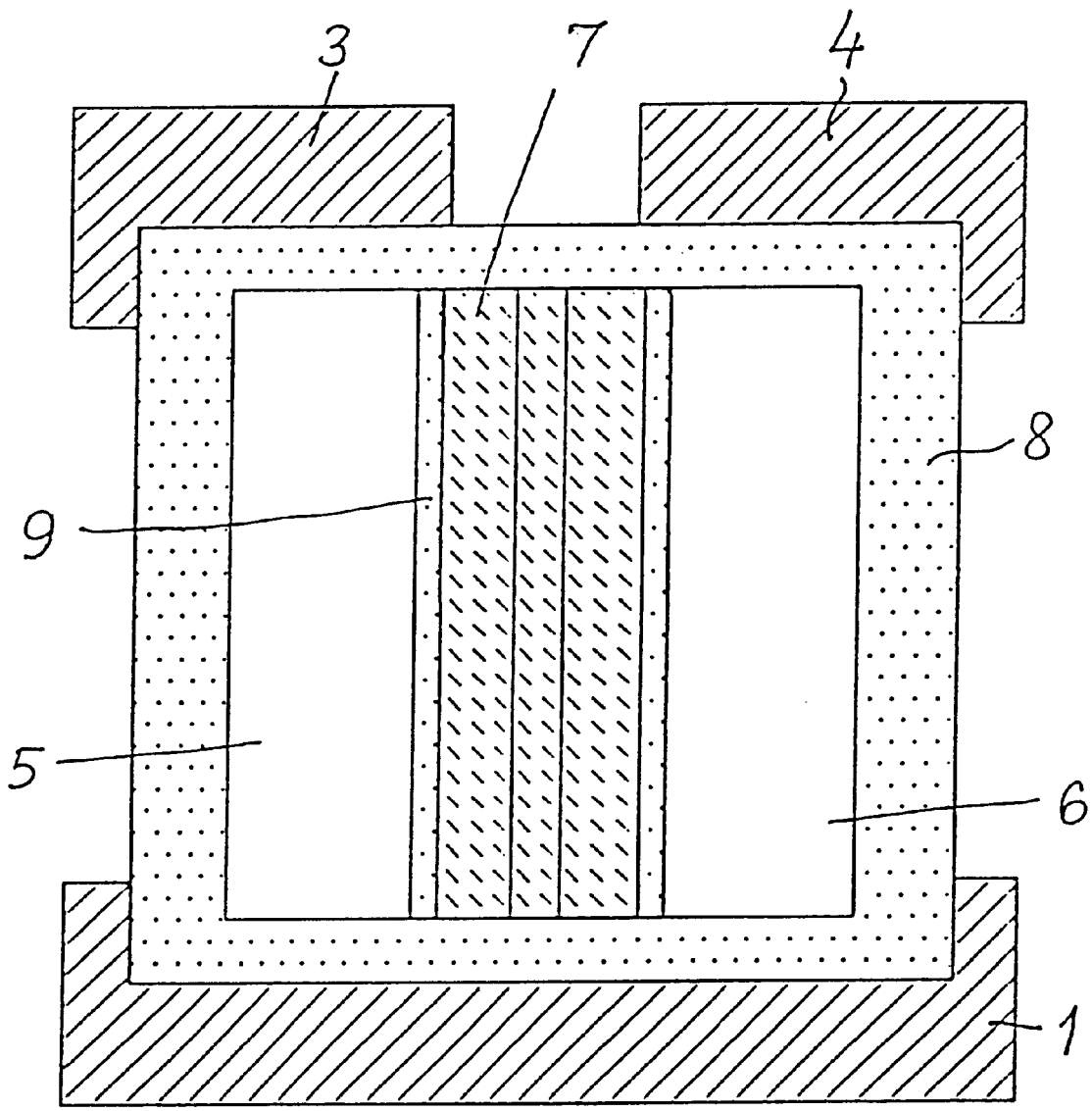
FIG. 4 is a top-view draft of the SMAGFET illustrated in FIG. 3.

In FIG. 3 a perspective view of the simple SMAGFET embodiment is shown. A top view of the same structure is given in FIG. 4. The labelling and associated description is as above (FIG. 2).

A few additional details of the SMAGFET is disclosed in FIG. 3:

The layer labelled 8 illustrates the isolation layer between G1 (5) and G2 (6) contacts and the channels beneath G1 (5) and G2 (6). The layer labelled 9 illustrates the isolation layer between Gc (7) and G1 (5), G2 (6) and the channel beneath Gc (7).

The gate contacts G1 (5), G2 (6) are typically made of poly-Silicon. The third gate contact is made of a second layer of poly-Silicon. The isolation layers (8, 9) are typically made of Silicon-dioxide. The drain regions (3, 4) and the common source region (1) are made of doped silicon.

The SMAGFET is to be fabricated as a planar field effect structure. The device is symmetrical along the centreline of Gc (7) (parallel to the current flow). The structure features two equal sized drain contacts (3, 4), two equal sized gate regions (5, 6) with associated isolated gate contacts, a third isolated gate region and associated contacts Gc (7) placed in between G1 (5) and C2 (6), on the symmetry line and overlapping equally a minor part of G1 (5) and G2 (6). The common source is (1).

Normally, the bias voltages at G1 (5) and G2 (6) are set equal. Similar, the voltages at the drains (5, 6) are set equal. The level of the source current is controlled by the voltage difference between G1 (5) and the common source (1) and G2 (6) and the common source (1) and the voltages at the drains (3, 4) both referenced to the common source (1).

In case of zero magnetic field, the current transport in the structure is perpendicular from the two drains (3, 4) to perpendicular to the common source (1). The current transport is performed in inversion layers in the channels beneath G1 (5) and G2 (6). Ideally, the current into the two drains are equal and exact half the size of the current going out of the common source (1).

In case of a non-zero magnetic field perpendicular to the planar surface of the SMAGFET, the current transport in the structure is still from the two drains (3, 4) to the common source (1). However, the Lorentz force caused by the magnetic field, acting on the moving carriers, tries to deflect the carriers in a plane parallel to the device surface. In case the SMAGFET is in the zero sensitivity mode, an electrical field in the channel, compensating the Lorentz force, will be created and no current redistribution between the two drains (3, 4) will take place. In case the SMAGFET is in the full sensitivity mode, the carriers will be deflected causing a (minor) current redistribution between the two drains (3, 4). The resulting drain current difference is proportional to the magnetic induction.

Figure 5:
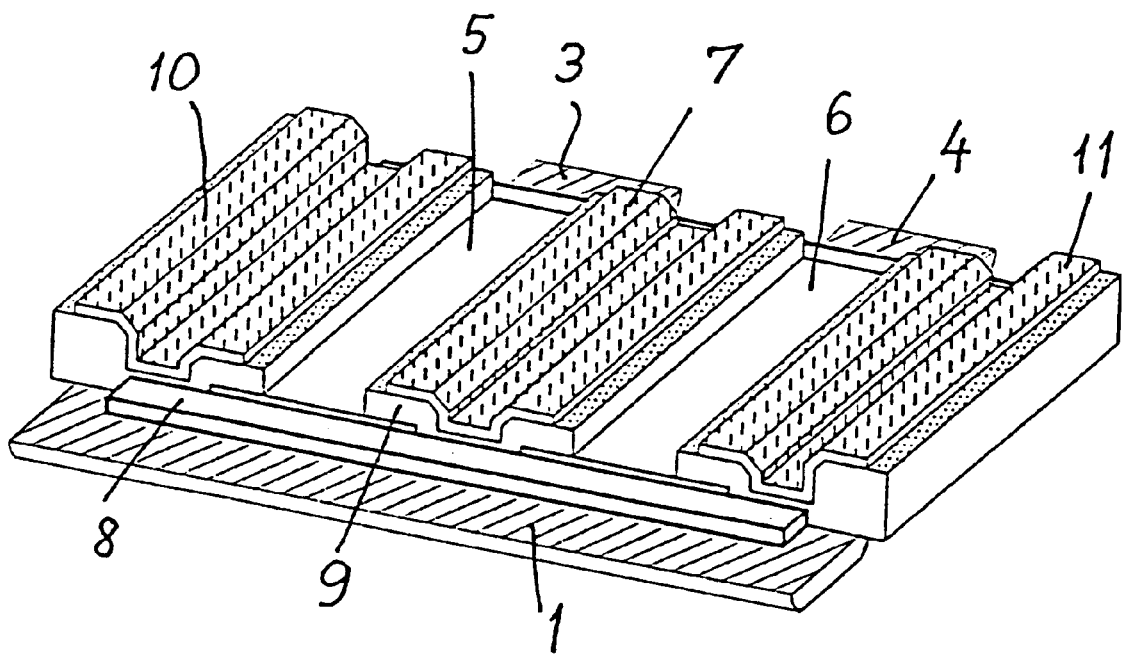
FIG. 5 is a draft illustrating the second embodiment of the SMAGFET in a perspective view.

The second embodiment of the invention is illustrated in FIG. 5. The comments for FIG. 3 and FIG. 4 apply to this figure as well with the following addendums:

The two dummy gate regions Gcd1 and Gcd2 (10, 11) shown in FIG. 5 are added in this embodiment to compensate for the slightly different edge conditions present beneath Gc (7) when the SMAGFET is in full or zero sensitivity mode. As it is important to maintain the same effective width of the channels beneath G1 (5) and G2 (6) in the two sensitivity modes in order to ensure that the offset does not change between the two modes, the dummy gate regions Gcd1 and Gcd2 (10, 11) may be switched with a common voltage at same level but with the opposite phase of the voltage applied to Gc (7). By doing so, the effective width of G1 (5) and G2 (6) remains virtually unchanged between mode changes as the width is controlled by the same sum of edge conditions in both modes.

The voltage applied to Gcd1 and Gcd2 may be generated by inverting the switching voltage used for Gc (7).

Figure 6:
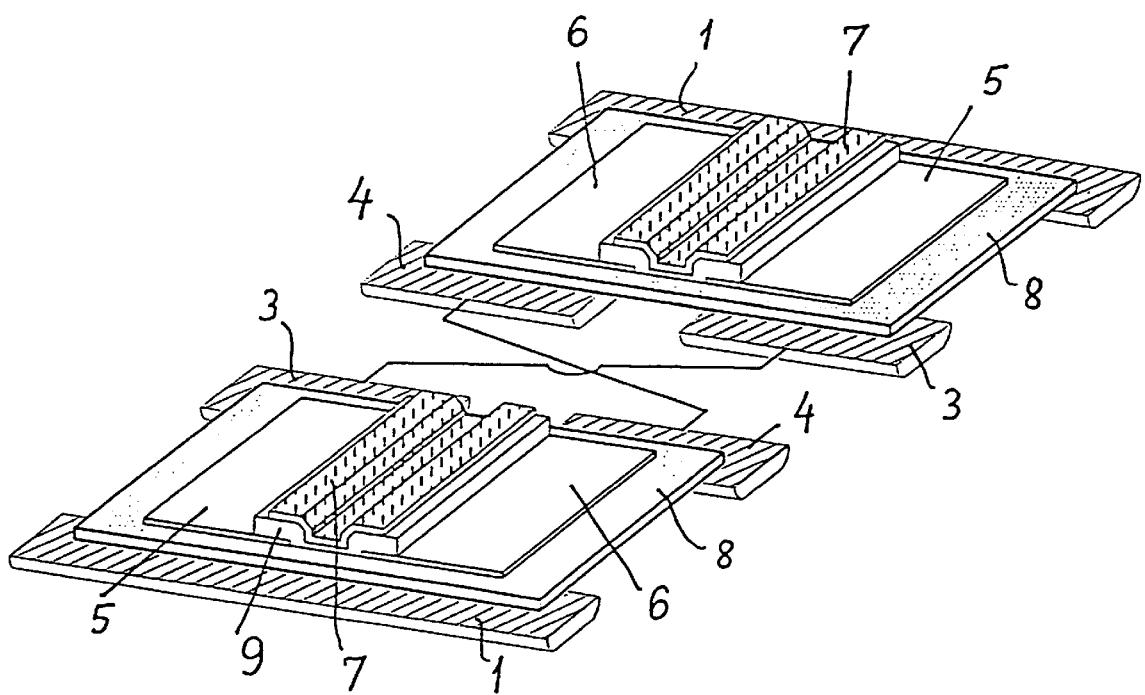
FIG. 6 is a draft illustrating the third embodiment of the SMAGFET in a perspective view.

The third embodiment of the invention is illustrated in FIG. 6. The comments for FIG. 3 and FIG. 4 apply to this figure as well with the following addendums:

In practice the third gate contact Gc (7) is often somewhat (unintentionally) misaligned to the symmetry line of the simple SMAGFET device. This asymmetry gives a slightly mode dependent offset preventing full offset compensation by 'correlated double sampling'.

By placing a simple SMAGFET on each side of a symmetry line and connect terminals as shown in FIG. 6, a first order cancellation of misaligned (non-symmetrical) SMAGFETs may be obtained.

The above described embodiments of this invention are compatible with most modern double poly CMOS processes and may easily be monolithic integrated with most analogue and/or digital circuitry.

However the invention is not restricted to Silicon technology and/or usual base materials. The SMAGFET concept may be realised in other microcircuit technologies such as GaAs based technology. The key requirements are high Hall mobility of carriers and well characterised third gate threshold voltage level.

I claim:

1. A magnetic field sensitive field effect transistor (MAGFET) comprising a semiconductor substrate having two equal sized drains and a common source opposite the two drains, and a gate area including first and second gates of equal size and insulated from each other, and a third gate being placed between the first and second gates and slightly overlapping but electrically insulated from the first and second gates, the third gate extending completely between the source and the two drains, the first and second gates being placed symmetrically on the substrate along a center line of the third gate.

2. A magnetic field sensitive field effect transistor according to claim 1, wherein a first voltage on the third gate creates an electrically conductive inversion layer beneath the third gate, the inversion layer establishing electrical connection between the portions of the substrate beneath the first and second gates, and a second voltage on the third gate creates an electrically substantially non conducting depletion layer beneath the third gate, the depletion layer electrically insulating the portions of the substrate beneath the first and second gates from each other.

3. A magnetic field sensitive field effect transistor according to claim 1, wherein two additional dummy gate regions are placed along the first and second gates opposite the third gate.

4. A magnetic field sensitive field effect transistor device, comprising two magnetic field sensitive field effect transistors according to claim 1 in a configuration in which their drains are cross coupled.

* * * * *